(12) United States Patent
Ito et al.

(10) Patent No.: US 11,694,890 B2
(45) Date of Patent: Jul. 4, 2023

(54) SUBSTRATE PROCESSING METHOD AND SUBSTRATE PROCESSING APPARATUS

(71) Applicant: Tokyo Electron Limited, Tokyo (JP)

(72) Inventors: Kiwamu Ito, Nirasaki (JP); Keiko Hosoe, Nirasaki (JP); Yamato Tonegawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 127 days.

(21) Appl. No.: 16/829,222

(22) Filed: Mar. 25, 2020

(65) Prior Publication Data

US 2020/0312654 A1 Oct. 1, 2020

(30) Foreign Application Priority Data

Mar. 27, 2019 (JP) ................. 2019-061653

(51) Int. Cl.
*H01L 21/67* (2006.01)
*H01L 21/02* (2006.01)
*C23C 16/455* (2006.01)

(52) U.S. Cl.
CPC .. *H01L 21/02123* (2013.01); *C23C 16/45536* (2013.01); *H01L 21/0228* (2013.01); *H01L 21/02345* (2013.01); *H01L 21/67017* (2013.01)

(58) Field of Classification Search
CPC ........... H01L 21/02123; H01L 21/0228; H01L 21/0217; H01L 21/02211
See application file for complete search history.

(56) References Cited

U.S. PATENT DOCUMENTS

| | | | |
|---|---|---|---|
| 6,468,924 B2* | 10/2002 | Lee | C23C 16/405 |
| | | | 438/763 |
| 10,388,511 B2 | 8/2019 | Tonegawa | |
| 10,410,857 B2* | 9/2019 | Suzuki | C23C 16/45542 |
| 10,526,701 B2* | 1/2020 | Kumar | C23C 16/45542 |
| 10,580,645 B2* | 3/2020 | Ueda | H01L 21/02274 |
| 11,164,955 B2* | 11/2021 | Zhu | H01L 29/517 |
| 11,168,395 B2* | 11/2021 | Sreeram | C23C 16/455 |
| 11,171,025 B2* | 11/2021 | Jeong | H01L 21/67017 |
| 2006/0216418 A1* | 9/2006 | Matsuura | C23C 16/45542 |
| | | | 427/248.1 |
| 2006/0216481 A1 | 9/2006 | Suzuki | |
| 2007/0128858 A1* | 6/2007 | Haukka | H01L 29/4966 |
| | | | 438/656 |

(Continued)

FOREIGN PATENT DOCUMENTS

JP 2006-278497 A 10/2006
JP 2008-306093 A 12/2008

(Continued)

*Primary Examiner* — Jarrett J Stark
(74) *Attorney, Agent, or Firm* — Nath, Goldberg & Meyer; Jerald L. Meyer; Tanya E. Harkins

(57) ABSTRACT

A substrate processing method for forming a nitride film on a substrate, includes: a raw material gas supply step of supplying a raw material gas containing an element to be nitrided; a hydrogen gas supply step of, after the raw material gas supply step, supplying a hydrogen gas activated by plasma; a thermal nitriding step of supplying a first nitriding gas containing nitrogen activated by heat and nitriding the element; and a plasma nitriding step of supplying a second nitriding gas containing nitrogen activated by plasma and nitriding the element.

11 Claims, 17 Drawing Sheets

(56) References Cited

U.S. PATENT DOCUMENTS

| | | | |
|---|---|---|---|
| 2008/0124945 A1* | 5/2008 | Miya | H01L 21/02178 |
| | | | 438/778 |
| 2015/0275368 A1 | 10/2015 | Motoyama et al. | |
| 2016/0365246 A1 | 12/2016 | Yamamoto et al. | |
| 2019/0211434 A1* | 7/2019 | Espallargas | C23C 18/1635 |
| 2020/0312654 A1* | 10/2020 | Ito | C23C 16/45536 |
| 2020/0318237 A1* | 10/2020 | Fukazawa | C23C 16/45536 |
| 2021/0198787 A1 | 7/2021 | Tonegawa et al. | |
| 2022/0013333 A1 | 1/2022 | Tabu et al. | |

FOREIGN PATENT DOCUMENTS

| | | |
|---|---|---|
| JP | 2012-142386 A | 7/2012 |
| JP | 2013-093551 A | 5/2013 |
| JP | 2018-11009 A | 1/2018 |

* cited by examiner

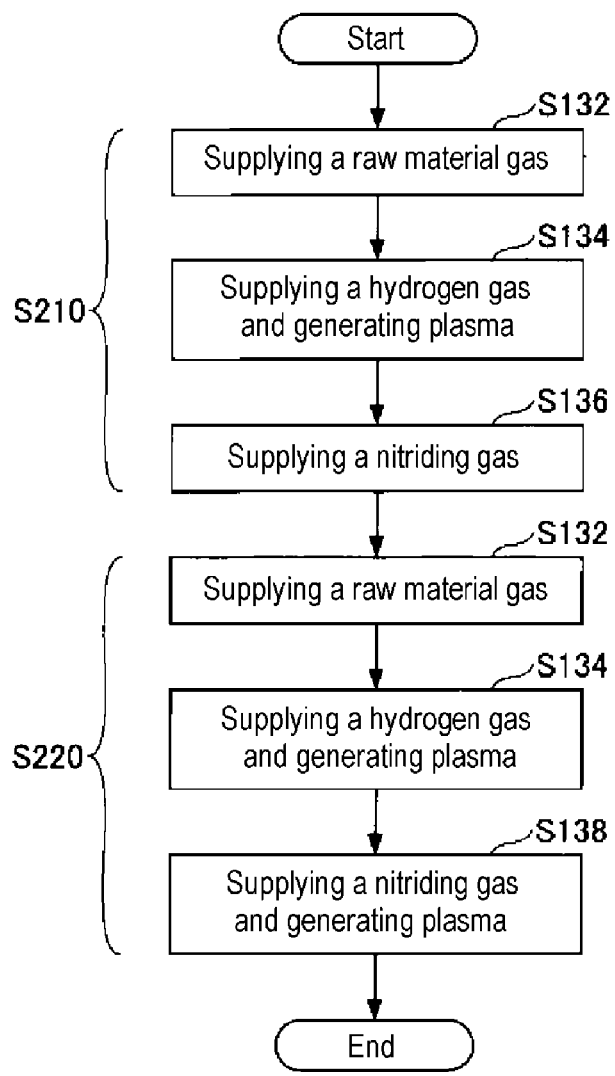

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-061653, filed on Mar. 27, 2019, the entire contents of which are incorporated herein by reference.

TECHNICAL FIELD

The present disclosure relates to a substrate processing method and a substrate processing apparatus.

BACKGROUND

As a manufacturing process for manufacturing a semiconductor device, there is a case where a silicon nitride (SiN) film, which is a nitride film, is formed on a surface of a semiconductor substrate. An ALD (Atomic Layer Deposition) method is used for forming such a SiN film. When the SiN film is formed by the ALD method, a dichlorosilane (DCS: $SiH_2Cl_2$) gas and an ammonia ($NH_3$) gas are alternately supplied as raw material gases.

PRIOR ART DOCUMENT

Patent Document

Patent Document 1: Japanese Laid-Open Patent Publication No. 2012-142386
Patent Document 2: Japanese Laid-Open Patent Publication No. 2018-011009

SUMMARY

According to one embodiment of the present disclosure, there is provided a substrate processing method for forming a nitride film on a substrate, including: a raw material gas supply step of supplying a raw material gas containing an element to be nitrided; a hydrogen gas supply step of, after the raw material gas supply step, supplying a hydrogen gas activated by plasma; a thermal nitriding step of supplying a first nitriding gas containing nitrogen activated by heat and nitriding the element; and a plasma nitriding step of supplying a second nitriding gas containing nitrogen activated by plasma and nitriding the element.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 18 is a flowchart of a substrate processing method according to a second embodiment.

DETAILED DESCRIPTION

Figure 1:
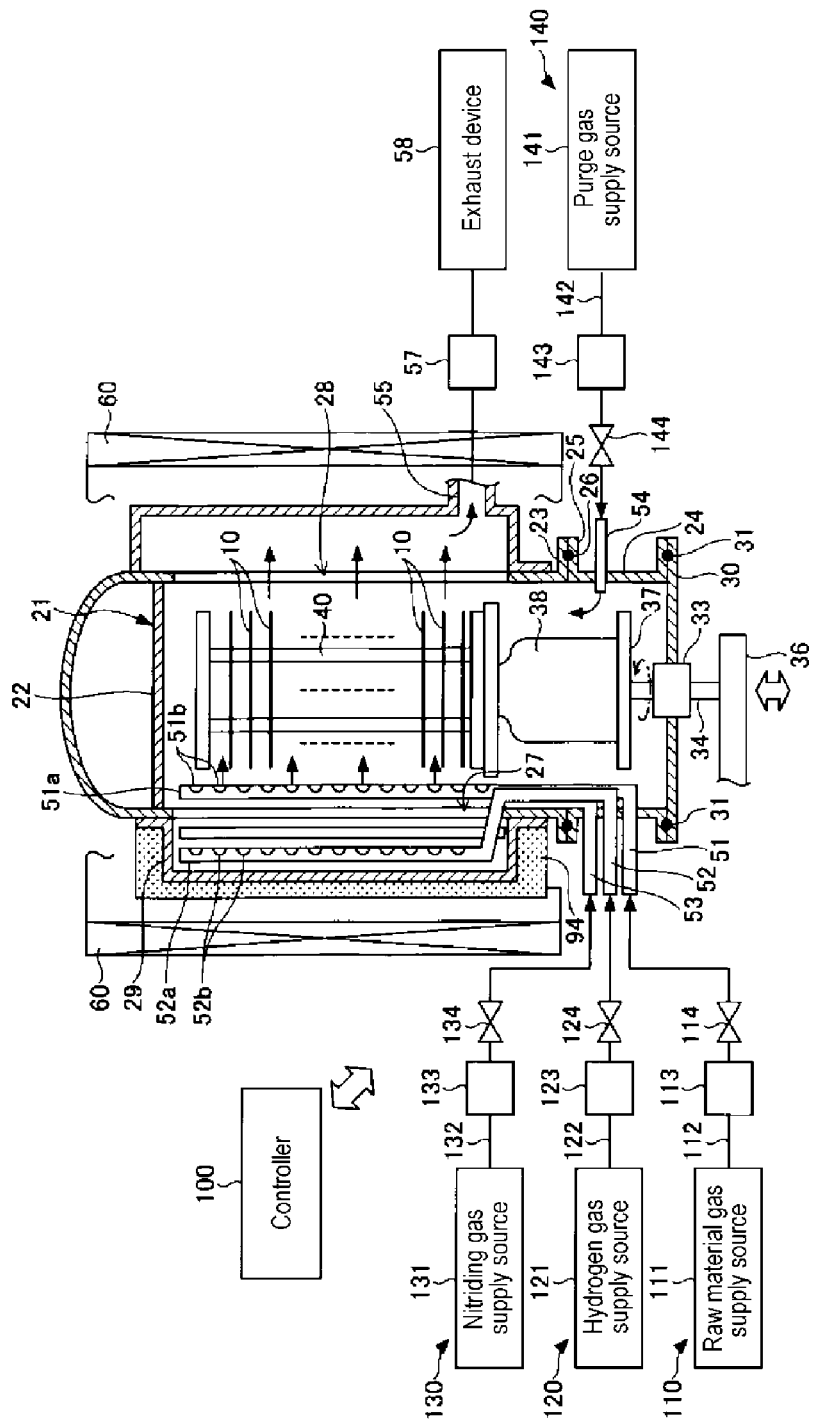
FIG. 1 is a structural diagram of a substrate processing apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments will be described below. The same members and the like are denoted by like reference numerals, and the description thereof is omitted.

First Embodiment (Substrate Processing Apparatus)

A substrate processing apparatus according to a first embodiment will be described with reference to FIGS. 1 and 2. The substrate processing apparatus according to the present embodiment is an apparatus for forming a film using an ALD method and is configured to form a nitride film or the like. In the description of the substrate processing apparatus according to the present embodiment, there will be described a case where a SiN film is formed as a nitride film. However, the substrate processing apparatus according to the present embodiment may also be applicable to the formation of a SiBN film or the like described later. In the substrate processing apparatus according to the present embodiment, when forming a SiN film, a Si raw material gas, for example, a dichlorosilane gas and a nitriding gas, for example, an ammonia gas are alternately supplied.

The substrate processing apparatus according to the present embodiment is a batch-type vertical substrate processing apparatus that performs substrate processing on a plurality of substrates at a time. The substrate processing apparatus according to the present embodiment is not limited to the vertical substrate processing apparatus, and may be, for example, a single-substrate-type apparatus that processes substrates such as semiconductor wafers or the like one by one. Furthermore, the substrate processing apparatus according to the present embodiment may be a semi-batch-type apparatus. The semi-batch type apparatus rotates a plurality of substrates arranged around a rotation center axis of a rotary table together with the rotary table, and allows the substrates to sequentially pass through a plurality of regions to which different gases are supplied.

The substrate processing apparatus according to the present embodiment includes a processing container 21 having a space in which substrates 10 are processed, a lid 30 configured to hermetically close a lower end opening of the processing container 21, and a substrate holder 40 configured to hold the substrates 10. The substrates 10 are, for example, semiconductor substrates, and more specifically, silicon wafers. The substrate holder 40 is also called a wafer boat.

The processing container 21 includes a cylindrical processing container body 22 having a ceiling and an open lower end. The processing container body 22 is made of, for example, quartz. A flange portion 23 is formed at a lower end of the processing container body 22. The processing container 21 includes a manifold 24 having, for example, a cylindrical shape. The manifold 24 is made of, for example, stainless steel. A flange portion 25 is formed at an upper end of the manifold 24. The flange portion 23 of the processing container body 22 is provided on the flange portion 25. A seal member 26 such as an O-ring or the like is interposed between the flange portion 25 and the flange portion 23.

The lid 30 is air-tightly attached to the lower end opening of the manifold 24 via a seal member 31 such as an O-ring or the like. The lid 30 is made of, for example, stainless steel. A through-hole that penetrates the lid 30 in the vertical direction is formed at the center of the lid 30. A rotating shaft 34 is disposed in the through hole. The gap between the lid 30 and the rotating shaft 34 is sealed by a magnetic fluid seal part 33. The lower end portion of the rotating shaft 34 is rotatably supported by an arm 36 of a lifting part (not shown). A rotating plate 37 is provided at the upper end portion of the rotating shaft 34. On the rotating plate 37, the substrate holder 40 is installed via a heat insulating table 38.

The substrate holder 40 holds a plurality of substrates 10 at intervals in the vertical direction. Each of the plurality of substrates 10 is horizontally held. The substrate holder 40 is made of, for example, quartz ($SiO_2$) or silicon carbide (SiC). When the arm 36 is raised by a lifting part (not shown), the lid 30 and the substrate holder 40 are moved upward, the substrate holder 40 is loaded into the processing container 21, and the lower end opening of the processing container 21 is closed by the lid 30. When the arm 36 is lowered by the lifting part (not shown), the lid 30 and the substrate holder 40 are moved downward, and the substrate holder 40 is unloaded from the processing container 21. When the rotating shaft 34 is rotated, the substrate holder 40 rotates together with the rotating plate 37.

The substrate processing apparatus according to the present embodiment includes four gas supply pipes 51, 52, 53 and 54. The gas supply pipes 51, 52, 53 and 54 are made of, for example, quartz ($SiO_2$), and are configured to supply gases into the processing container 21. Since four types of gases are used in the present embodiment, the four gas supply pipes 51, 52, 53 and 54 are provided. The types of gases will be described later. One gas supply pipe may sequentially discharge plural types of gases, or a plurality of gas supply pipes may simultaneously discharge the same type of gas.

The gas supply pipes 51, 52 and 53 include, for example, nozzle portions 51a, 52a and 53a vertically disposed inside the processing container body 22. The nozzle portions 51a, 52a and 53a have a plurality of gas discharge ports 51b, 52b and 53b formed at intervals in the vertical direction. The plurality of gas discharge ports 51b, 52b and 53b discharge gases horizontally. The nozzle portions 51a, 52a and 53a are connected to the horizontal portions of the gas supply pipes 51, 52 and 53 that horizontally extend and penetrate through the manifold 24, respectively. The gases supplied to the respective horizontal portions are sent to the nozzle portions 51a, 52a and 53a, and are horizontally discharged from the respective gas discharge ports 51b, 52b and 53b. On the other hand, the gas supply pipe 54 horizontally extends and penetrates through the manifold 24. The gas supplied to the gas supply pipe 54 from the outside of the manifold 24 is discharged into the manifold 24.

The substrate processing apparatus according to the present embodiment is provided with an exhaust pipe 55. The interior of the processing container 21 is evacuated via the exhaust pipe 55. An exhaust port 28 is provided in the processing container body 22 to evacuate the interior of the processing container 21. The exhaust port 28 is disposed so as to face the gas discharge ports 51b, 52b and 53b. The gases discharged horizontally from the gas discharge ports 51b, 52b and 53b pass through the exhaust port 28, and are exhausted from the exhaust pipe 55.

An opening/closing valve 57 and an exhaust device 58 are connected to the exhaust pipe 55 in this order. The exhaust inside the processing container 21 is controlled by the opening and closing of the opening/closing valve 57. The opening/closing valve 57 also serves as a pressure control valve for controlling the gas pressure inside the processing container 21. The exhaust device 58 includes a vacuum pump and exhausts the gas existing inside the processing container 21. The exhausted gas is sent to an abatement device (not shown). After removing harmful components, the exhaust gas is discharged to the atmosphere.

The substrate processing apparatus according to the present embodiment includes a processing container heater 60. The processing container heater 60 heats the inside of the processing container 21, thereby improving the processing capability for the gas supplied into the processing container 21. The processing container heater 60 is disposed outside the processing container 21 to heat the inside of the processing container 21 from the outside of the processing container 21. For example, the processing container heater 60 is formed in a cylindrical shape so as to surround the processing container body 22. The processing container heater 60 is formed of, for example, an electric heater or the like.

The substrate processing apparatus according to the present embodiment includes a raw material gas supply part 110, a hydrogen gas supply part 120, a nitriding gas supply part 130, and a purge gas supply part 140. A raw material gas is supplied from the raw material gas supply part 110 into the processing container 21. The raw material gas contains an element to be nitrided (e.g., silicon).

As the raw material gas, for example, a dichlorosilane (DCS: $SiH_2Cl_2$) gas is used. Although the raw material gas is the DCS gas in this description, the present embodiment is not limited thereto. As the raw material gas, in addition to the DCS gas, it may be possible to use, for example, a monochlorosilane (MCS: $SiH_3Cl$) gas, a trichlorosilane (TCS: $SiHCl_3$) gas, a silicon tetrachloride (STC: $SiCl_4$) gas, a hexachlorodisilane (HCDS: $Si_2Cl_6$) gas, a diiodosilane (DIS: $SiH_2I_2$) gas, a triiodosilane (TIS: $SiHI_3$) gas and the like. By supplying these gases, a Si-containing layer containing silicon (Si) is formed on the substrate 10. The Si-containing layer contains a halogen element in addition to Si. This is because the raw material gas contains a halogen element. Therefore, the raw material gas is a compound gas containing an element to be nitrided and a halogen element.

The raw material gas supply part 110 includes a raw material gas supply source 111, a raw material gas pipe 112, a flow rate controller 113 and a valve 114. The raw material gas supply source 111 and the gas supply pipe 51 are connected by the raw material gas pipe 112. The raw material gas is supplied from the raw material gas supply source 111 to the gas supply pipe 51. The raw material gas is horizontally discharged toward the substrates 10 from the gas discharge ports 51b of the nozzle portion 51a. The flow rate controller 113 and the valve 114 are provided in the middle of the raw material gas pipe 112. The flow rate of the raw material gas is controlled by the flow rate controller 113, and the supply of the raw material gas is controlled by opening and closing the valve 114.

The hydrogen gas supply part 120 supplies a hydrogen gas into the processing container 21 to modify the Si-containing layer. The modification of the Si-containing layer includes, for example, removal of the halogen element contained in the Si-containing layer. By removing the halogen element, a dangling bond of Si is formed. As a result, the Si-containing layer is activated, and the nitriding of the Si-containing layer is promoted. In the present embodiment, when supplying the hydrogen gas, an inert gas may be mixed and supplied together with the hydrogen ($H_2$) gas.

The hydrogen gas supply part 120 includes a hydrogen gas supply source 121, a hydrogen gas pipe 122, a flow rate controller 123 and a valve 124. The hydrogen gas supply source 121 and the gas supply pipe 52 are connected by the hydrogen gas pipe 122. The hydrogen gas is supplied from the hydrogen gas supply source 121 to the gas supply pipe 52. The hydrogen gas is horizontally discharged toward the substrates 10 from the gas discharge ports 52b of the nozzle portion 52a. The flow rate controller 123 and the valve 124 are provided in the middle of the hydrogen gas pipe 122. The flow rate of the hydrogen gas is controlled by the flow rate controller 123, and the supply of the hydrogen gas is controlled by opening and closing the valve 124.

The nitriding gas supply part 130 supplies a nitriding gas into the processing container 21 to nitride the Si-containing layer. As the nitriding gas, for example, an ammonia ($NH_3$) gas or a nitrogen ($N_2$) gas is used. Furthermore, an organic hydrazine compound gas, an amine-based gas, a NO gas, a $N_2O$ gas, or a $NO_2$ gas is used. As the organic hydrazine compound gas, it may be possible to use, for example, a hydrazine ($N_2H_4$) gas, a diazene ($N_2H_2$) gas, a monomethylhydrazine (MMH) gas or the like. As the amine-based gas, it may be possible to use, for example, a monomethylamine gas or the like.

The nitriding gas supply part 130 includes a nitriding gas supply source 131, a nitriding gas pipe 132, a flow rate controller 133 and a valve 134. The nitriding gas supply source 131 and the gas supply pipe 53 are connected by the nitriding gas pipe 132. The nitriding gas is supplied from the nitriding gas supply source 131 to the gas supply pipe 53. The nitriding gas is horizontally discharged toward the substrates 10 from the gas discharge ports 53b of the nozzle portion 53a. The flow rate controller 133 and the valve 134 are provided in the middle of the nitriding gas pipe 132. The flow rate of the nitriding gas is controlled by the flow rate controller 133, and the supply of the nitriding gas is controlled by opening and closing the valve 134.

The purge gas supply part 140 supplies a purge gas into the processing container 21 to remove the raw material gas, the hydrogen gas and the nitriding gas remaining in the processing container 21. As the purge gas, for example, an inert gas is used. As the inert gas, a rare gas such as an Ar gas or the like, or a $N_2$ gas is used.

The purge gas supply part 140 includes a purge gas supply source 141, a purge gas pipe 142, a flow rate controller 143 and a valve 144. The purge gas supply source 141 and the gas supply pipe 54 are connected by the purge gas pipe 142. The purge gas is supplied from the purge gas supply source 141 to the gas supply pipe 54. The purge gas supplied to the gas supply pipe 54 is discharged into the manifold 24. The flow rate controller 143 and the valve 144 are provided in the middle of the purge gas pipe 142. The flow rate of the purge gas is controlled by the flow rate controller 143, and the supply of the purge gas is controlled by opening and closing the valve 144.

In the present embodiment, there has been described the case where the nozzle portion 52a supplied with the hydrogen gas and the nozzle portion 53a supplied with the nitriding are provided. Alternatively, the hydrogen gas and the nitriding gas may be supplied alternately through one nozzle portion. Furthermore, there has been described the case where the purge gas is supplied from the purge gas supply source 141 via the gas supply pipe 54. Alternatively, the purge gas may be supplied from any one of the gas supply pipes 51, 52 and 53.

Figure 2:
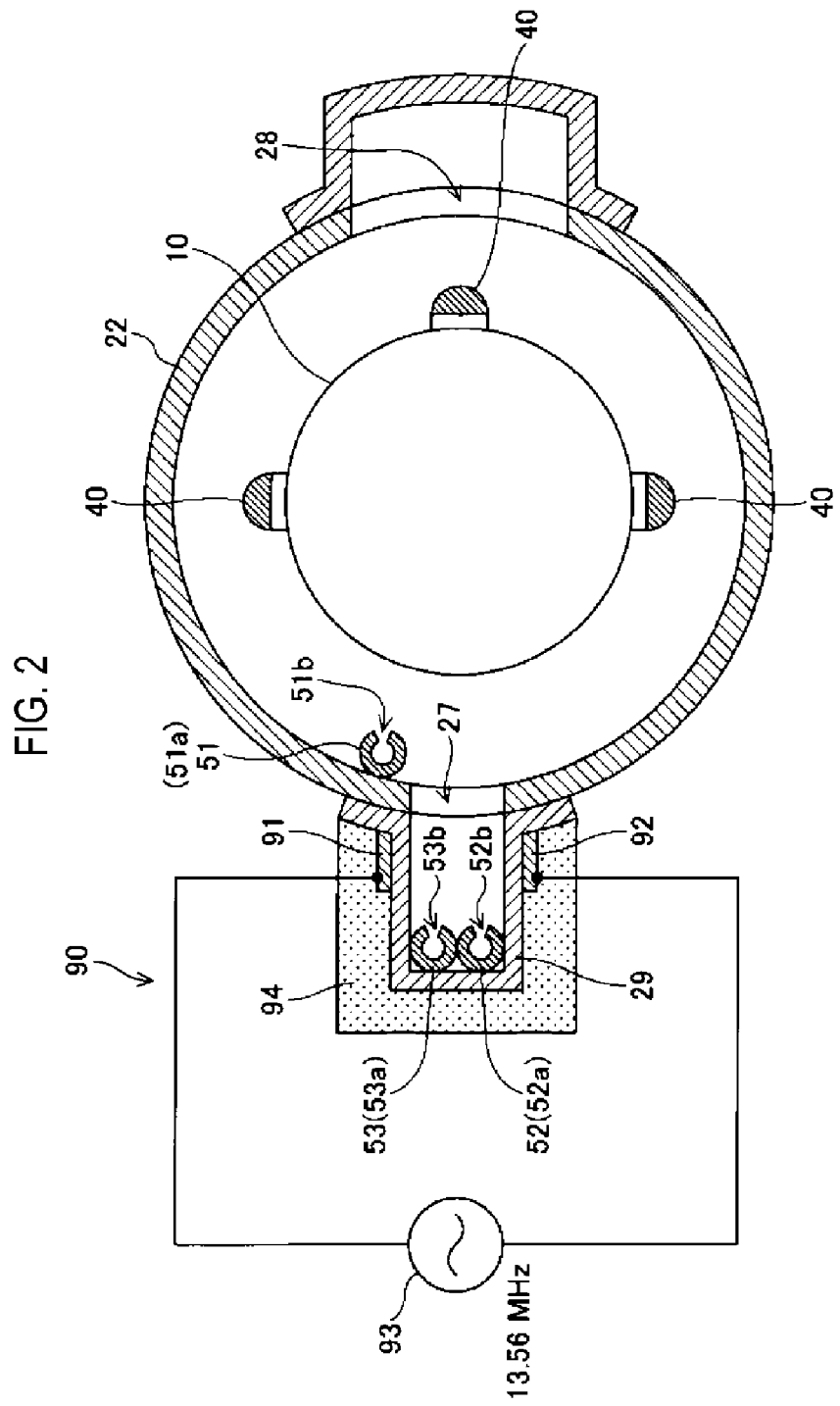
FIG. 2 is an explanatory view (1) of the substrate processing apparatus according to the first embodiment.

In the present embodiment, as shown in FIG. 2, an opening 27 is formed in a portion of the processing container body 22 in the circumferential direction, and an accommodation portion 29 is provided so as to surround the opening 27. The accommodation portion 29 is formed so as to protrude radially outward from the processing container body 22, and is formed, for example, in a U-shape when viewed in the vertical direction.

The accommodation portion 29 accommodates the nozzle portion 52a of the gas supply pipe 52 for supplying the hydrogen gas and the nozzle portion 53a of the gas supply pipe 53 for supplying the nitriding gas. The hydrogen gas is horizontally discharged from the gas discharge ports 52b of the nozzle portion 52a of the gas supply pipe 52 toward the opening 27, and is supplied into the processing container body 22 through the opening 27. Similarly, the nitriding gas is horizontally discharged from the gas discharge ports 53b of the nozzle portion 53a of the gas supply pipe 53 toward the opening 27, and is supplied into the processing container body 22 through the opening 27.

On the other hand, the nozzle portion 51a of the gas supply pipe 51 for supplying the raw material gas is disposed outside the accommodation portion 29 and inside the processing container body 22.

A plasma generator includes, for example, a pair of electrodes 91 and 92 arranged so as to interpose the accommodation portion 29 between the electrodes 91 and 92, and a high-frequency power source (RF power source) 93 that applies a high-frequency voltage to between the electrodes 91 and 92. The electrodes 91 and 92 are elongated in the vertical direction just like the nozzle portions 52a and 53a of the gas supply pipes 52 and 53. In addition, an insulating protection cover 94 is provided so as to cover the outer surface of the accommodation portion 29 on which the pair of the electrodes 91 and 92 is provided.

By applying the high-frequency voltage to between the electrodes 91 and 92, high-frequency power is applied to the internal space of the accommodation portion 29. The hydrogen gas is converted into plasma by the high-frequency power in the internal space of the accommodation portion 29, and hydrogen radicals are generated. The hydrogen radicals are supplied into the processing container body 22 through the opening 27 to modify the Si-containing layer.

The modification of the Si-containing layer includes, for example, removal of the halogen element contained in the Si-containing layer. By removing the halogen element, a dangling bond of Si is formed. As a result, the Si-containing layer can be activated, and the nitriding of the Si-containing layer can be promoted. The nitriding of the Si-containing layer is performed after the modification of the Si-containing layer.

When the nitriding gas is supplied from the nozzle portion 53a of the gas supply pipe 53, a high-frequency voltage is applied to between the electrodes 91 and 92, thereby converting the nitriding gas into plasma and nitriding the Si-containing layer with the plasma. If the high-frequency voltage is applied to between the pair of the electrodes 91 and 92, the nitriding gas is not converted into plasma. Therefore, the Si-containing layer is thermally nitrided.

Figure 3:
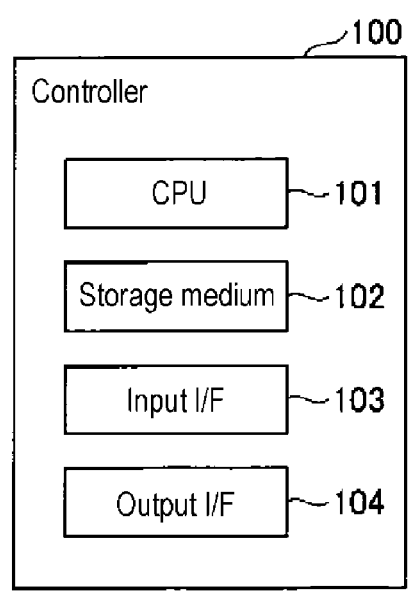
FIG. 3 is an explanatory view (2) of the substrate processing apparatus according to the first embodiment.

Next, a controller 100 in the substrate processing apparatus according to the present embodiment will be described with reference to FIG. 3. The substrate processing apparatus according to the present embodiment includes the controller 100.

The controller 100 is configured by, for example, a computer, and includes a CPU (Central Processing Unit) 101 and a storage medium 102 such as a memory or the like. The storage medium 102 stores a program for controlling various processes executed in the substrate processing apparatus according to the present embodiment. The controller 100 controls the operation of the substrate processing apparatus by causing the CPU 101 to execute the program stored in the storage medium 102. Furthermore, the controller 100 includes an input interface 103 and an output interface 104. The controller 100 receives a signal from the outside via the input interface 103 and transmits a signal to the outside via the output interface 104.

The aforementioned program may be stored in a computer-readable storage medium and may be installed in the storage medium 102 of the controller 100 from the storage medium. Examples of the computer-readable storage medium include a hard disk (HD), a flexible disk (FD), a compact disk (CD), a magnet optical desk (MO), a memory card, and the like. The program may be downloaded from a server via the Internet and may be installed in the storage medium 102 of the controller 100.

(Substrate Processing Method)

Figure 4:
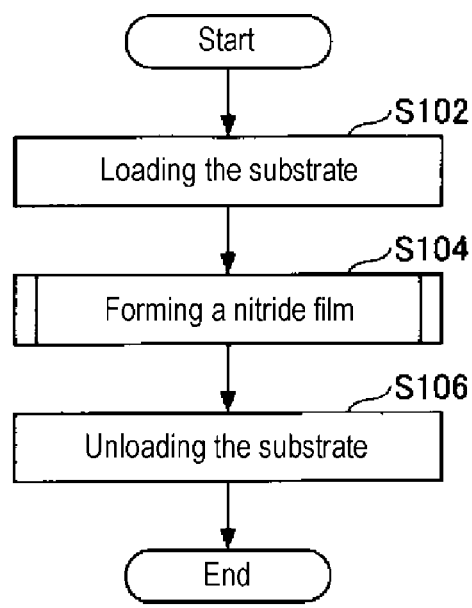
FIG. 4 is a flow chart of a substrate processing method.

An outline of a method for forming a nitride film using the substrate processing apparatus according to the present embodiment will be described with reference to FIG. 4. The steps in this film forming method are controlled by the controller 100. Furthermore, the film formation by the film forming method may be repeatedly performed.

First, as shown in step 102 (S102), the substrates 10 are loaded into the processing container 21. Specifically, the substrates 10 are placed on the substrate holder 40 outside the processing container 21. The substrates 10 are horizontally held by the substrate holder 40 at intervals in the vertical direction. Thereafter, the arm 36 is raised by the lifting part (not shown) to raise the lid 30 and the substrate holder 40, whereby the substrates 10 are loaded into the processing container 21 together with the substrate holder 40, and the lower end opening of the processing container 21 is sealed by the lid 30.

Next, as shown in step 104 (S104), a nitride film is formed on the substrate 10. Specifically, the inside of the processing container 21 is evacuated until the pressure inside the processing container 21 reaches a predetermined pressure. After the predetermined pressure is reached, the gases used for film formation are sequentially supplied into the processing container 21 to form a nitride film on the substrate 10 rotated together with the substrate holder 40. When forming the nitride film, the inside of the processing container 21 is heated by the processing container heater 60. The temperature at which the nitride film is formed on the substrate 10 is, for example, in a range of from 400 degrees C. to 650 degrees C. The pressure inside the processing container 21 is, for example, in a range of from 13 Pa to 1333 Pa. After the formation of the nitride film is completed, a purge gas is supplied, the evacuation of the inside of the processing container 21 is stopped, and the pressure inside the processing container 21 is returned to the atmospheric pressure.

Next, as shown in step 106 (S106), the substrates 10 are unloaded from the processing container 21. Specifically, the arm 36 is lowered by the lifting part (not shown) to lower the lid 30 and the substrate holder 40. Thus, the lower end opening of the processing container 21 closed by the lid 30 is opened, and the substrates 10 are unloaded from the processing container 21 together with the substrate holder 40. Thereafter, the substrates 10 are removed from the substrate holder 40.

Through the above-described steps, a nitride film can be formed on the substrate. Thereafter, by repeating the same steps as described above, it is possible to sequentially perform the formation of nitride films on the plurality of substrates 10.

Figure 10:
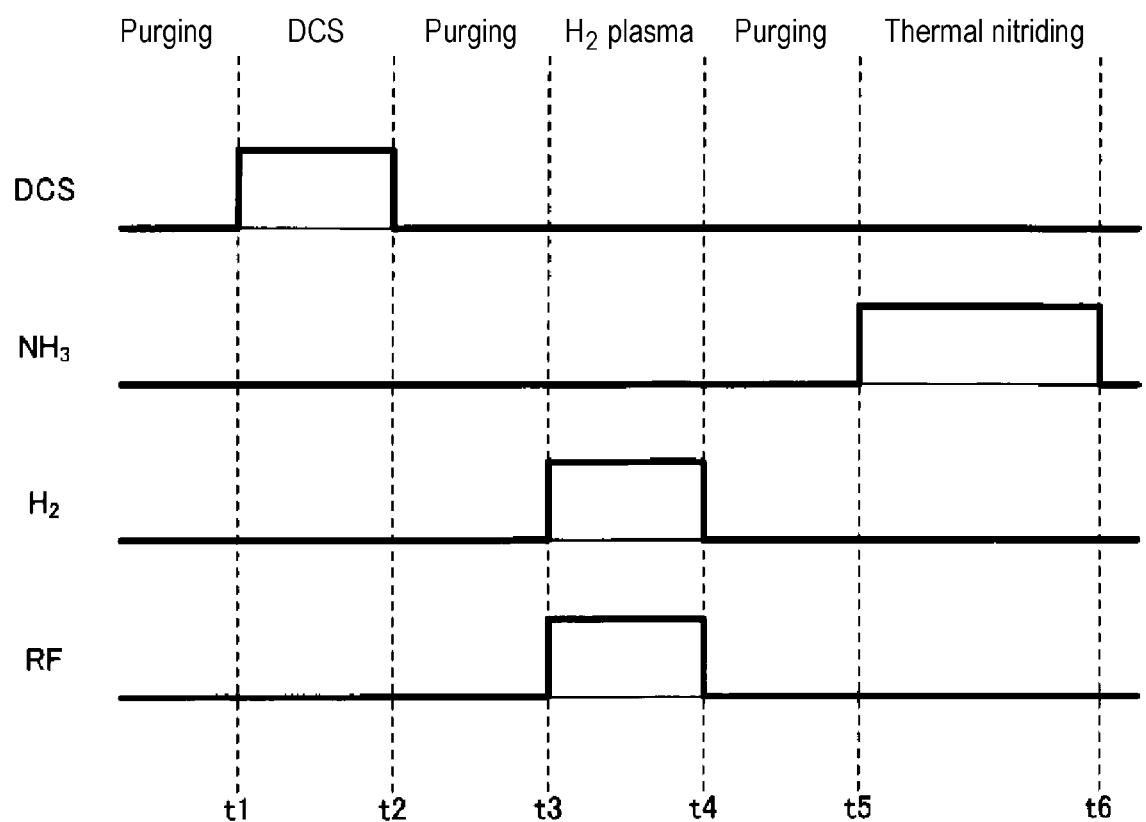
FIG. 10 is a time chart illustrating film forming method 3.
Figure 11:
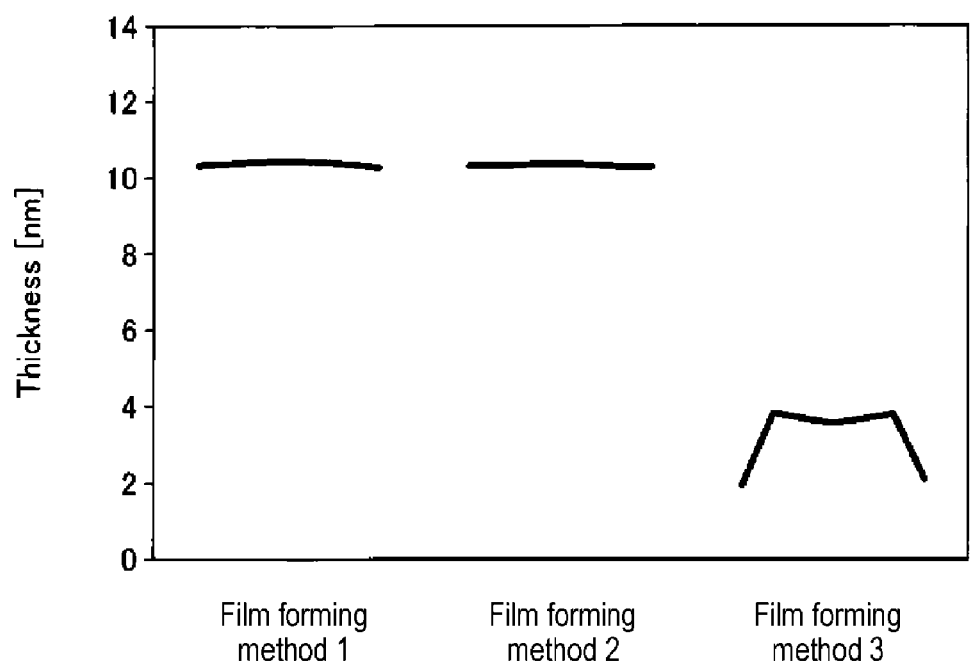
FIG. 11 is an explanatory diagram of film distributions of nitride films formed by film forming methods 1 to 3.

Next, the results of the study on a nitride film forming method conducted by the present inventor will be described. Specifically, first, a method of forming a nitride film by plasma nitriding will be described with reference to FIGS. 5 and 6. Next, a method of forming a nitride film, which includes a step of supplying hydrogen plasma, will be described with reference to FIGS. 7 and 8. Furthermore, a method for forming a nitride film by thermal nitriding, which includes a step of supplying hydrogen plasma, will be described with reference to FIGS. 9 and 10. When generating plasma, a high-frequency voltage is applied by the high-frequency power source (RF power source) 93. Therefore, the high-frequency power may be referred to as RF power in some cases. The nitride film to be formed is a silicon nitride (SiN) film. FIG. 11 schematically shows the film distributions (the film thickness distributions in the peripheral portion, the central portion and the peripheral portion of the substrate) of the nitride films formed on the substrates having a flat surface by the aforementioned respective film forming methods.

(Film Forming Method 1 of Nitride Film (Plasma Nitriding))

Figure 5:
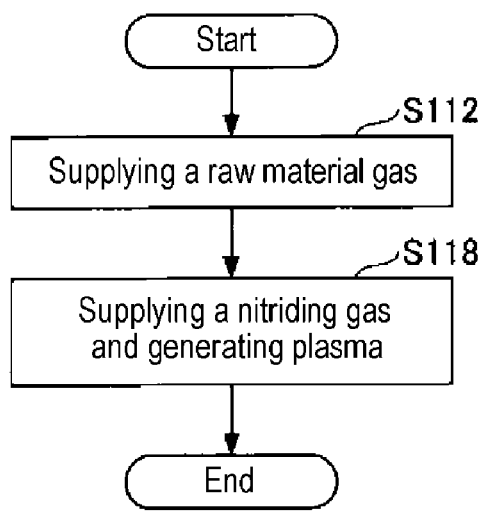
FIG. 5 is a flow chart of film forming method 1.
Figure 6:
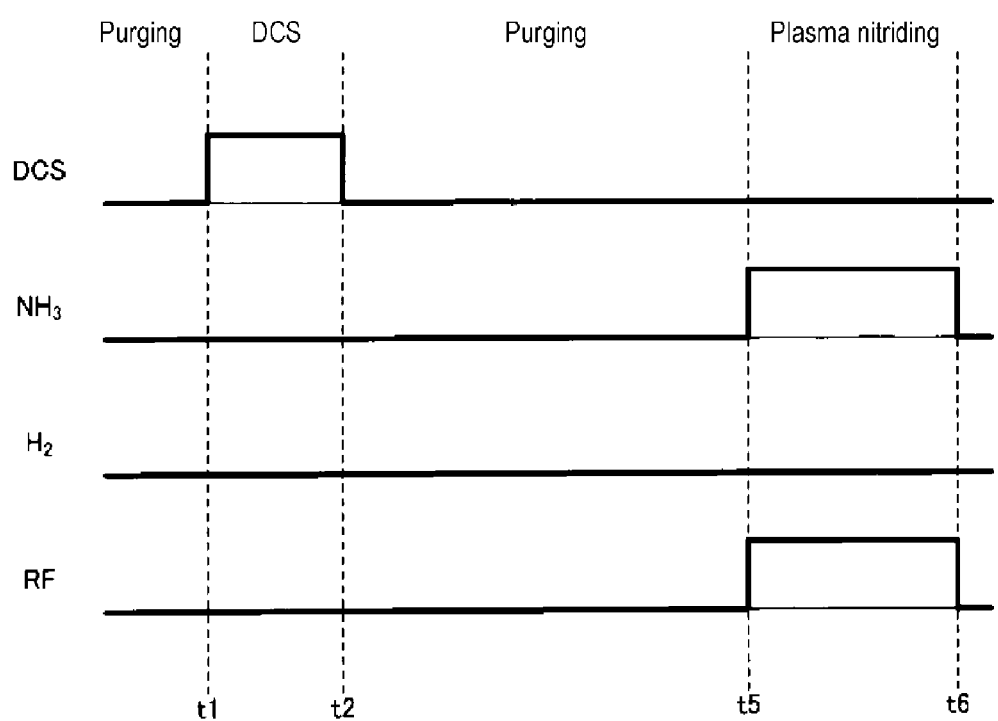
FIG. 6 is a time chart illustrating film forming method 1.

Method 1 for forming a nitride film by plasma nitriding will be described with reference to FIGS. 5 and 6. In this film forming method, a purge gas is supplied by the purge gas supply part 140 into the processing container 21, the inside of which is evacuated by the exhaust device 58. Thus, the gas remaining inside the processing container 21 is replaced with the purge gas. The flow rate of the purge gas is, for example, in a range of from 50 sccm to 5000 sccm. In the step of forming a nitride film, the purge gas is continuously supplied into the processing container 21. Purging with the purge gas is performed in a state in which a raw material gas and a nitriding gas are not supplied.

First, as shown in step 112 (S112), a raw material gas supply step of supplying a raw material gas is performed. Specifically, the raw material gas is supplied from the raw material gas supply part 110 into the processing container 21, the inside of which is evacuated by the exhaust device

58. The raw material gas is, for example, a DCS gas. Thus, a Si-containing layer is formed on the surface of the substrate 10. The flow rate of the raw material gas is, for example, in a range of from 500 sccm to 3000 sccm. As shown in FIG. 6, this step is performed from time t1 to time t2, which time period is 2 seconds to 10 seconds. The supply of the raw material gas is stopped at time t2. Thereafter, a purging step is performed from time t2 to time t5.

Next, as shown in step 118 (S118), a plasma nitriding step of supplying a plasma-converted nitriding gas is performed. Specifically, a nitriding gas is supplied from the nitriding gas supply part 130 into the processing container 21, the inside of which is evacuated by the exhaust device 58. The nitriding gas is, for example, an ammonia gas which is converted to plasma by the plasma generator 90. The Si-containing layer is nitrided by the active species of the ammonia gas thus generated. The flow rate of the nitriding gas is, for example, in a range of from 500 sccm to 7000 sccm. As shown in FIG. 6, this step is performed from time t5 to time t6, which time period is 15 seconds to 60 seconds.

In this film forming method, the above-described steps are defined as one cycle, and are repeated by a plurality of cycles until a predetermined film thickness is obtained, thereby forming a nitride film. At time t6, the supply of the nitriding gas is stopped, and the generation of plasma is also stopped. Thereafter, a purging step is performed during the time period from time t6 to the next supply of the raw material gas.

The film distribution of the nitride film formed by this film forming method is indicated as film forming method 1 in FIG. 11. As shown in FIG. 11, the film distribution of the nitride film formed by this film forming method is such that the central portion and the peripheral portion of the nitride film are substantially flat.

(Film Forming Method 2 of Nitride Film (Plasma Nitriding))

Figure 7:
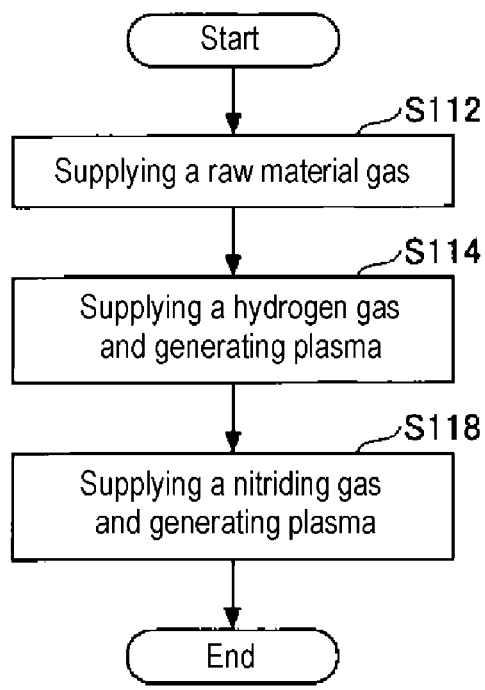
FIG. 7 is a flow chart of film forming method 2.
Figure 8:
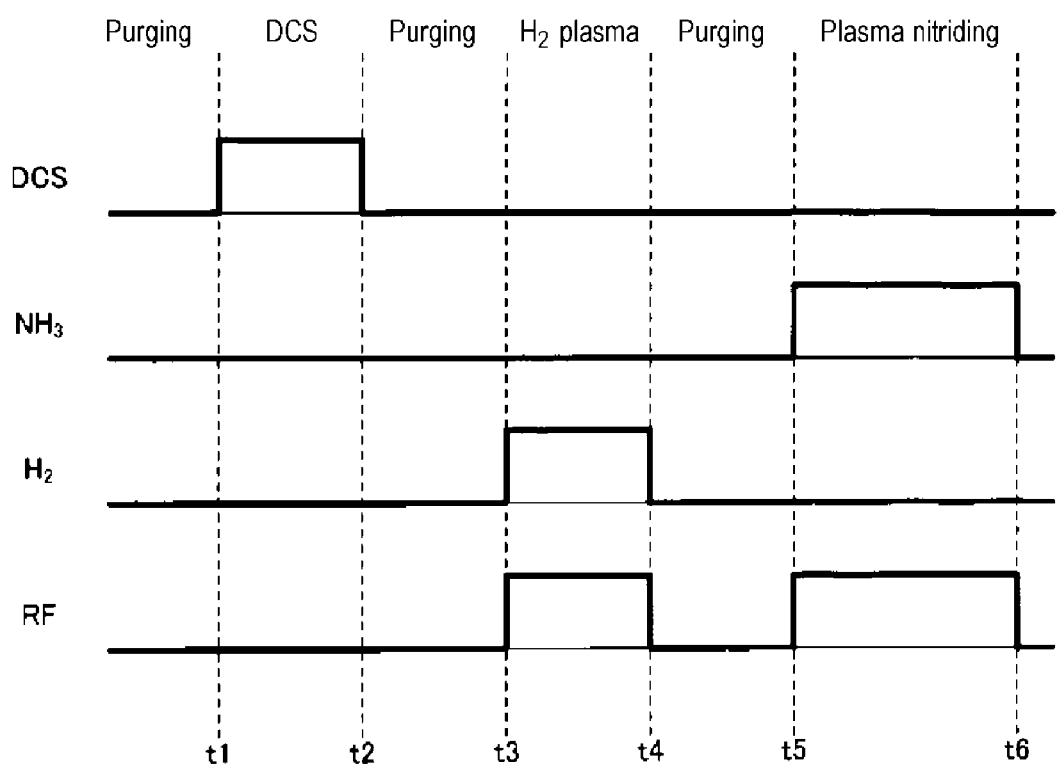
FIG. 8 is a time chart illustrating film forming method 2.

Method 2 of forming a nitride film by plasma nitriding will be described with reference to FIGS. 7 and 8. Also in this film forming method, just like the above-described method, a purge gas is supplied by the purge gas supply part 140 into the processing container 21 whose inside is evacuated by the exhaust device 58. Thus, the gas remaining inside the processing container 21 is replaced with the purge gas. The flow rate of the purge gas is, for example, in a range of from 50 sccm to 5000 sccm. In the step of forming the nitride film, the purge gas is continuously supplied into the processing container 21. Purging with the purge gas is performed in a state in which the raw material gas and the nitriding gas are not supplied.

First, as shown in step 112 (S112), a raw material gas supply step of supplying a raw material gas is performed. Specifically, the raw material gas is supplied from the raw material gas supply part 110 into the processing container 21, the inside of which is evacuated by the exhaust device 58. The raw material gas is, for example, a DCS gas. Thus, a Si-containing layer is formed on the surface of the substrate 10. The flow rate of the raw material gas is, for example, in a range of from 500 sccm to 3000 sccm. As shown in FIG. 8, this step is performed from time t1 to time t2, which time period is 2 seconds to 10 seconds. The supply of the raw material gas is stopped at time t2. Thereafter, a purging step is performed from time t2 to time t3.

Next, as shown in step 114 (S114), a hydrogen gas supply step of supplying a plasma-converted hydrogen gas is performed. Specifically, a hydrogen gas is supplied from the hydrogen gas supply part 120 into the processing container 21, the inside of which is evacuated by the exhaust device 58. At this time, the hydrogen gas is supplied by being converted into plasma by the plasma generator 90. The flow rate of the hydrogen gas is, for example, in a range of from 500 sccm to 5000 sccm. As shown in FIG. 8, this step is performed from time t3 to time t4, which time period is 10 seconds to 60 seconds. At time t4, the supply of the hydrogen gas is stopped, and the generation of plasma is also stopped. Thereafter, a purging step is performed from time t4 to time t5.

Next, as shown in step 118 (S118), a plasma nitriding step of supplying a plasma-converted nitriding gas is performed. Specifically, a nitriding gas is supplied from the nitriding gas supply part 130 into the processing container 21, the inside of which is evacuated by the exhaust device 58. The nitriding gas is, for example, an ammonia gas which is converted into plasma by the plasma generator 90. The Si-containing layer is plasma-nitrided by the active species of the ammonia gas thus generated. The flow rate of the nitriding gas is, for example, in a range of from 500 sccm to 7000 sccm. As shown in FIG. 8, this step is performed from time t5 to time t6, which time period is 15 seconds to 60 seconds.

In this film forming method, the above-described steps are defined as one cycle, and are repeated by a plurality of cycles until a predetermined film thickness is obtained, thereby forming a nitride film. At time t6, the supply of the nitriding gas is stopped, and the generation of plasma is also stopped. Thereafter, a purging step is performed during the time period from time t6 to the next supply of the raw material gas.

The film distribution of the nitride film formed by this film forming method is indicated as film forming method 2 in FIG. 11. As shown in FIG. 11, the film distribution of the nitride film formed by this film forming method is such that the central portion and the peripheral portion of the nitride film are substantially flat.

(Film Forming Method 3 of Nitride Film (Thermal Nitriding))

Figure 9:
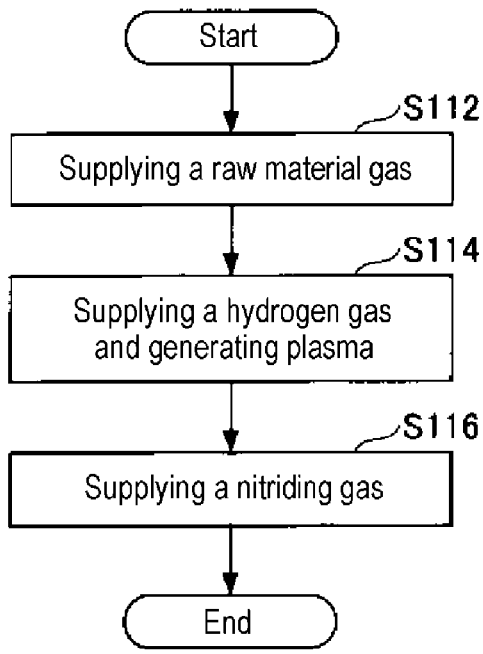
FIG. 9 is a flow chart of film forming method 3.

Method 3 of forming a nitride film by thermal nitriding will be described with reference to FIGS. 9 and 10. In this film forming method, plasma is not generated when supplying a nitriding gas. Nitriding is performed by the heat which is generated by the processing container heater 60 for heating the inside of the processing container 21. Such nitriding is referred to as thermal nitriding in some cases. In this film forming method, just like to the above-described method, the purge gas is supplied by the purge gas supply part 140 into the processing container 21, the inside of which is evacuated by the exhaust device 58. Thus, the gas remaining inside the processing container 21 is replaced with the purge gas. The flow rate of the purge gas is, for example, in a range of from 50 sccm to 5000 sccm. In the step of forming the nitride film, the purge gas is continuously supplied into the processing container 21. Purging with the purge gas is performed in a state in which the raw material gas and the nitriding gas are not supplied.

First, as shown in step 112 (S112), a raw material gas supply step of supplying a raw material gas is performed. Specifically, a raw material gas is supplied from the raw material gas supply part 110 into the processing container 21, the inside of which is evacuated by the exhaust device 58. The raw material gas is, for example, a DCS gas. Thus, a Si-containing layer is formed on the surface of the substrate 10. The flow rate of the raw material gas is, for example, in a range of from 500 sccm to 3000 sccm. As shown in FIG. 10, this step is performed from time t1 to time t2, which time period is 2 seconds to 10 seconds. The supply of the raw material gas is stopped at time t2. Thereafter, a purging step is performed from time t2 to time t3.

Next, as shown in step 114 (S114), a hydrogen gas supply step of supplying a plasma-converted hydrogen gas is performed. Specifically, a hydrogen gas is supplied from the hydrogen gas supply part 120 into the processing container 21, the inside of which is evacuated by the exhaust device 58. At this time, the hydrogen gas is supplied by being converted into plasma by the plasma generator 90. The flow rate of the hydrogen gas is, for example, in a range of from 500 sccm to 5000 sccm. As shown in FIG. 10, this step is performed from time t3 to time t4, which time period is 10 seconds to 60 seconds. The supply of the hydrogen gas is stopped at time t4. Thereafter, a purging step is performed from time t4 to time t5.

Next, as shown in step 116 (S116), a thermal nitriding step of supplying a nitriding gas without generating plasma is performed. Specifically, a nitriding gas is supplied from the nitriding gas supply part 130 into the processing container 21, the inside of which is evacuated by the exhaust device 58. The nitriding gas is, for example, an ammonia gas. The Si-containing layer is thermally nitrided by the ammonia gas heated by the processing container heater 60. The flow rate of the nitriding gas is, for example, in a range of from 500 sccm to 7000 sccm. As shown in FIG. 10, this step is performed from time t5 to time t6, which time period is 15 seconds to 60 seconds.

In this film forming method, the above-described steps are defined as one cycle, and are repeated by a plurality of cycles until a predetermined film thickness is obtained, thereby forming a nitride film. At time t6, the supply of the nitriding gas is stopped. Thereafter, a purging step is performed during the time period from time t6 to the next supply of the raw material gas.

The film distribution of the nitride film formed by this film forming method is indicated as film forming method 3 in FIG. 11. As shown in FIG. 11, the film distribution of the nitride film formed by this film forming method is such that the film thickness in the central portion is larger than the film thickness in the peripheral portion. When a film is formed on a substrate having irregularities on a surface thereof, it is possible to make substantially uniform the thickness distribution of the formed nitride film.

As a result of the above study, it was confirmed that by supplying the raw material gas, supplying the plasma-converted hydrogen gas and then performing the thermal nitriding as in the case of film forming method 3, the formed nitride film can be made to have a film distribution in which the film thickness in the central portion is larger than the film thickness in the peripheral portion.

(Hydrogen Concentration)

Figure 12:
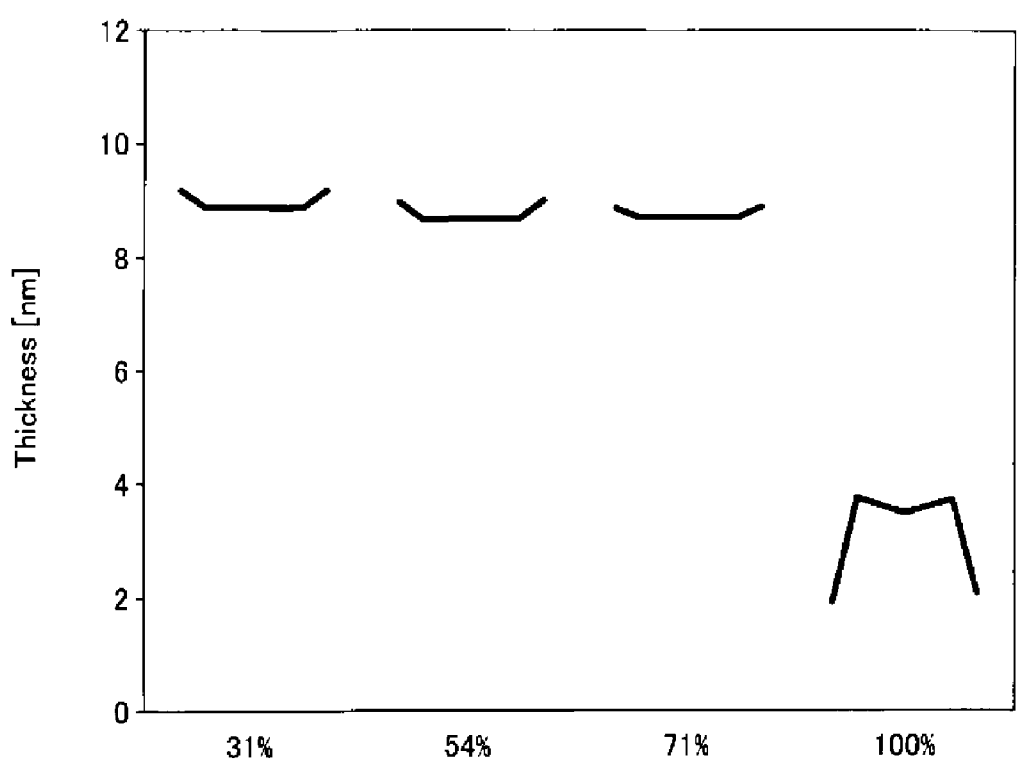
FIG. 12 is an explanatory diagram of film distributions of nitride films formed by changing a hydrogen concentration.

In the above-described film forming method 3, the nitrogen gas is supplied as the purge gas even during the formation of the nitride film. Therefore, the nitrogen gas is also supplied when supplying the hydrogen gas. FIG. 12 shows the result of investigating the relationship between the flow rate ratio of the hydrogen gas when supplying the hydrogen gas and the film distribution in the plane of the substrate. The hydrogen concentration indicates the concentration of hydrogen supplied into the processing container 21 and is a value given by (hydrogen flow rate)/(hydrogen flow rate+nitrogen flow rate). The pressure inside the processing container 21 is 0.2 Torr and is constant.

When the hydrogen concentration is 31%, the flow rate of nitrogen as a purge gas is 4450 sccm while the flow rate of hydrogen is 2000 sccm. When the hydrogen concentration is 54%, the flow rate of nitrogen as a purge gas is 1700 sccm while the flow rate of hydrogen is 2000 sccm. When the hydrogen concentration is 71%, the flow rate of nitrogen as a purge gas is 800 sccm while the flow rate of hydrogen is 2000 sccm. When the hydrogen concentration is 100%, nitrogen as a purge gas is not supplied, i.e., the flow rate of nitrogen is 0 sccm while the flow rate of hydrogen is 2000 sccm.

As shown in FIG. 12, when the hydrogen concentration is 31% or 54%, the thickness distribution of the formed nitride film is such that the film thickness in the peripheral portion is larger than the film thickness in the central portion. Even when the hydrogen concentration is 71%, the film distribution of the formed nitride film is such that the film thickness in the peripheral portion is slightly larger than the film thickness in the central portion. However, the difference in the film thickness is so small as to be almost flat. When the hydrogen concentration is 100%, the film distribution of the formed nitride film is such that the film thickness in the central portion is larger than the film thickness in the peripheral portion. Accordingly, in the present embodiment, the hydrogen concentration at the time of supplying the hydrogen gas is preferably 72% or more. Thus, the formed nitride film can be made to have a film concentration in which the film thickness in the central portion is larger than the film thickness in the peripheral portion.

(Formation of SiBN Film)

Figure 13:
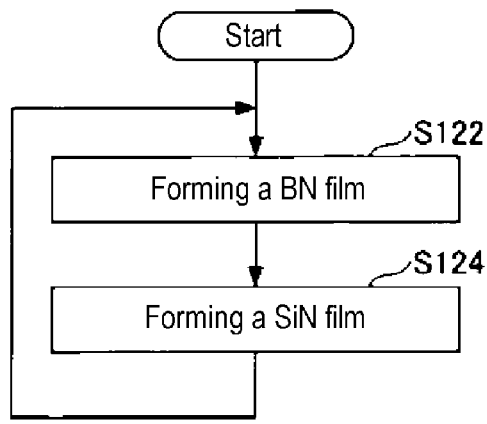
FIG. 13 is a flow chart of a method for forming a SiBN film.

Next, a case where a SiBN film is formed using the substrate processing apparatus according to the present embodiment will be described with reference to FIG. 13. As shown in FIG. 13, the SiBN film is formed by alternately repeating a step of forming a BN film in step 122 (S122) and a step of forming a SiN film in step 124 (S124), until a desired film thickness is obtained. In the present embodiment, the formation of the SiN film in step 124 is performed by two cycles when film forming method 1 shown in FIGS. 5 and 6 is defined as one cycle.

Figure 14:
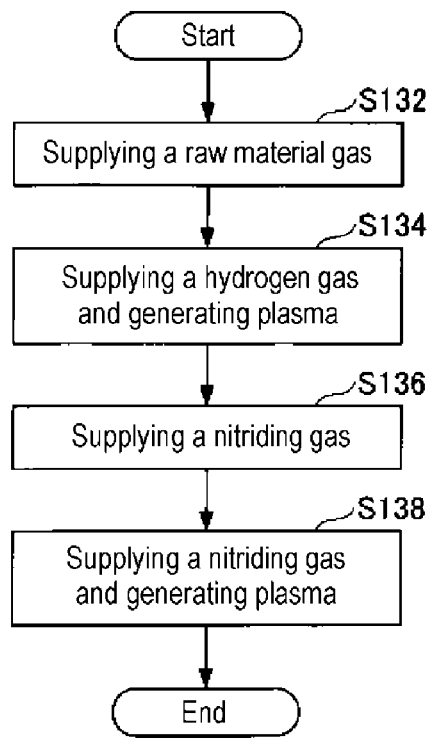
FIG. 14 is a flowchart of a substrate processing method according to the first embodiment.
Figure 15:
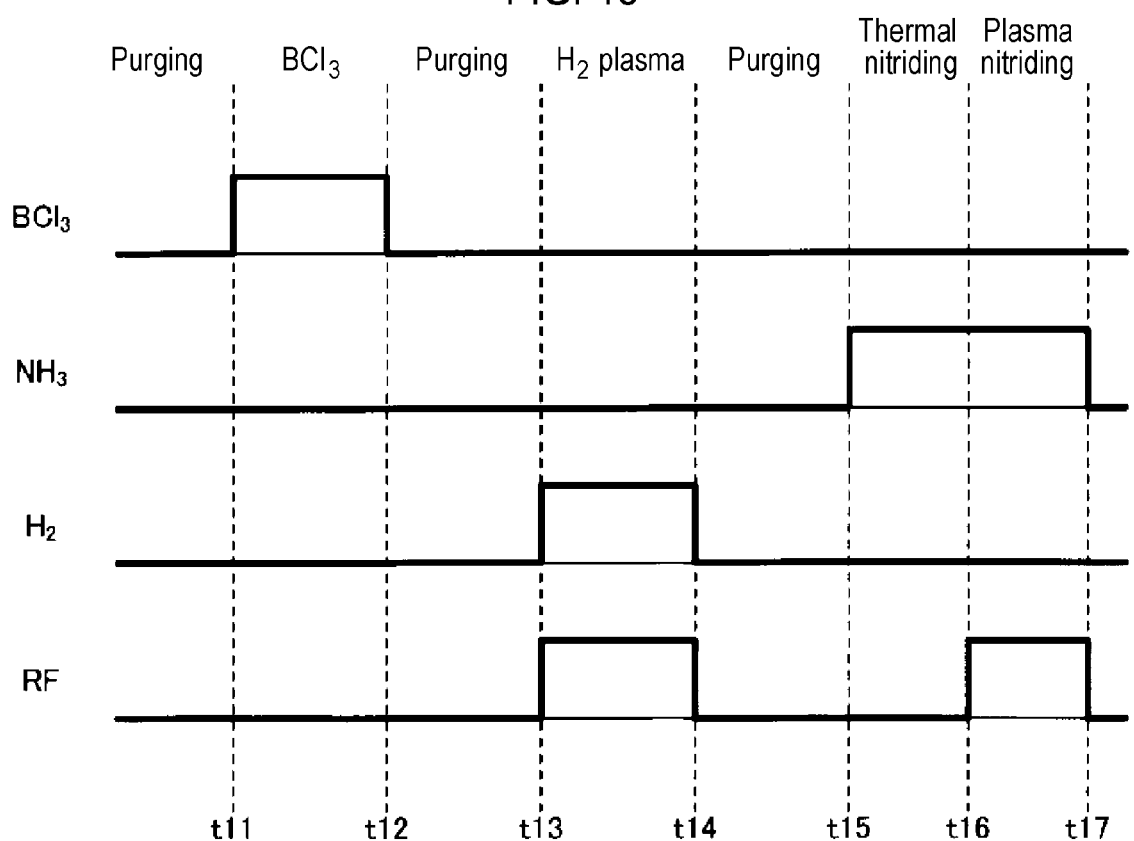
FIG. 15 is a time chart illustrating the substrate processing method according to the first embodiment.

First, the step of forming the BN film shown in step 122 will be described with reference to FIGS. 14 and 15. This film forming method is the substrate processing method according to the present embodiment, and will be described by taking as an example a case where the nitride film is a BN film.

Also in this film forming method, a purge gas is supplied by the purge gas supply part 140 into the processing container 21, the inside of which is evacuated by the exhaust device 58. Thus, the gas remaining inside the processing container 21 is replaced with the purge gas. The flow rate of the purge gas is, for example, in a range of from 50 sccm to 5000 sccm. The purge gas is continuously supplied into the processing container 21. Purging with the purge gas is performed in a state in which the raw material gas and the nitriding gas are not supplied.

First, as shown in step 132 (S132), a raw material gas supply step of supplying a raw material gas is performed. Specifically, a raw material gas is supplied from the raw material gas supply part 110 into the processing container 21, the inside of which is evacuated by the exhaust device 58. The raw material gas is, for example, a $BCl_3$ gas. Thus, a B-containing layer is formed on the surface of the substrate 10. The flow rate of the raw material gas is, for example, in a range of from 500 sccm to 3000 sccm. As shown in FIG. 15, this step is performed from time t11 to time t12, which time period is 5 seconds to 10 seconds. At time t12, the supply of the raw material gas is stopped. Thereafter, a purging step is performed from time t12 to time t13. Examples of the raw material gas include a boron halide gas such as a trifluoroborane ($BF_3$) gas, a tribromoborane ($BBr_3$) gas, a triiodoborane ($BI_3$) gas or the like, in addition to the $BCl_3$ gas.

Next, as shown in step 134 (S134), a hydrogen gas supply step of supplying a plasma-converted hydrogen gas is performed. Specifically, a hydrogen gas is supplied from the hydrogen gas supply part 120 into the processing container 21, the inside of which is evacuated by the exhaust device 58. At this time, RF power is applied by the plasma generator 90 to convert the hydrogen gas into plasma and to supply the plasma-converted hydrogen gas. The flow rate of the hydrogen gas is, for example, in a range of from 500 sccm to 5000 sccm or less. As shown in FIG. 15, this step is performed from time t13 to time t14, which time period is 10 seconds to 60 seconds. At time t14, the supply of the hydrogen gas is stopped, and the generation of the plasma is also stopped. Thereafter, a purging step is performed from time t14 to time t15.

Next, as shown in step 136 (S136), a thermal nitriding step of supplying a nitriding gas without generating plasma is performed. Specifically, a nitriding gas is supplied by the nitriding gas supply part 130 into the processing container 21, the inside of which is evacuated by the exhaust device 58. The nitriding gas is, for example, an ammonia gas. The B-containing layer is thermally nitrided by the ammonia gas heated by the processing container heater 60. The flow rate of the nitriding gas is, for example, in a range of from 500 sccm to 7000 sccm. This step is performed from time t15 to time t16 as shown in FIG. 15.

Next, as shown in step 138 (S138), a plasma nitriding step of supplying a plasma-converted nitriding gas is performed. Specifically, a nitriding gas is supplied from the nitriding gas supply part 130 into the processing container 21, the inside of which is evacuated by the exhaust device 58. The nitriding gas is, for example, an ammonia gas. RF power is applied by the plasma generator 90 to convert the ammonia gas into plasma. The B-containing layer is plasma-nitrided by the active species of the ammonia gas thus generated. The flow rate of the nitriding gas is, for example, in a range of from 500 sccm to 7000 sccm. This step is performed from time t16 to time t17 as shown in FIG. 15. At time t17, the supply of the nitriding gas is stopped, and the generation of the plasma is also stopped. Thereafter, a purging step is performed during the time period from time t17 to the next supply of the raw material gas.

Next, a step of forming a SiN film shown in step 124 will be described. In the step of forming the SiN film, the steps of film forming method 1 shown in FIGS. 5 and 6 are defined as one cycle and are repeated by two cycles.

Figure 16:
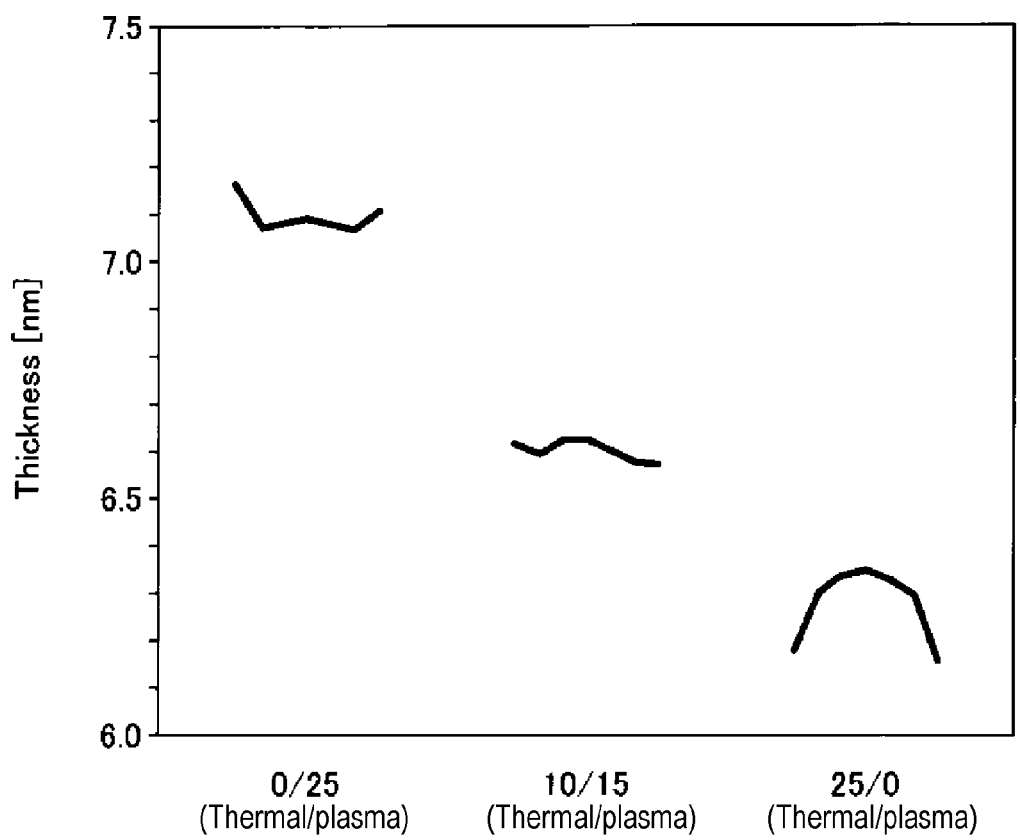
FIG. 16 is an explanatory diagram of film distributions of nitride films formed by the substrate processing method according to the first embodiment.

The film distribution of the SiBN film formed by the above steps will be described with reference to FIG. 16. The thermal/plasma on the horizontal axis in FIG. 16 indicates the ratio of the thermal nitriding time to the plasma nitriding time when forming a BN film. Specifically, the sum of the thermal nitriding time in step 136 and the plasma nitriding time in step 138 is set to 25 seconds, and the ratio of the thermal nitriding time to the plasma nitriding time (thermal/plasma) is indicated.

When the thermal/plasma is 0/25, the thermal nitriding time is 0 second and the plasma nitriding time is 25 seconds (the nitriding is performed only by the plasma nitriding). As shown in FIG. 16, the film distribution of the formed SiBN film is such that the film thickness in the peripheral portion is larger than the film thickness in the central portion.

When the thermal/plasma is 10/15, the thermal nitriding time is 10 seconds and the plasma nitriding time is 15 seconds. As shown in FIG. 16, the film distribution of the formed SiBN film is such that the film thickness is substantially the same in the central portion and the peripheral portion.

When the thermal/plasma is 25/0, the thermal nitriding time is 25 seconds and the plasma nitriding time is 0 second (the nitriding is performed only by the thermal nitriding). As shown in FIG. 16, the film distribution of the formed SiBN film is such that the film thickness in the central portion is larger than the film thickness in the peripheral portion.

As described above, in the nitride film forming method which is the substrate processing method according to the present embodiment, a nitride film having a desired film distribution can be formed by changing the thermal/plasma time ratio. Accordingly, the nitride film can be formed in a desired film distribution by changing the thermal/plasma time ratio according to not only the case where the surface of the substrate is flat but also the state of irregularities formed on the surface.

The above-described film forming method can be applied to a nitride film other than the BN film and the SiBN film. Therefore, when the nitride film is formed, a nitride film having a desired film distribution can be formed by changing the ratio of the thermal nitriding time to the plasma nitriding time when forming the nitride film. Specifically, even when the SiN film is formed, a SiN film having a desired film distribution can be formed by changing the ratio of the thermal nitriding time to the plasma nitriding time when forming the SiN film.

In the above description, there has been described the case where the ratio of the thermal nitriding time to the plasma nitriding time is changed. The gas flow rate, the applied RF power or the like in the thermal nitriding and the plasma nitriding may be changed while keeping constant the thermal nitriding time and the plasma nitriding time. Even with such a method, the formed nitride film can be caused to have a desired film distribution.

(Mechanism of Nitride Film Formation)

Figure 17:
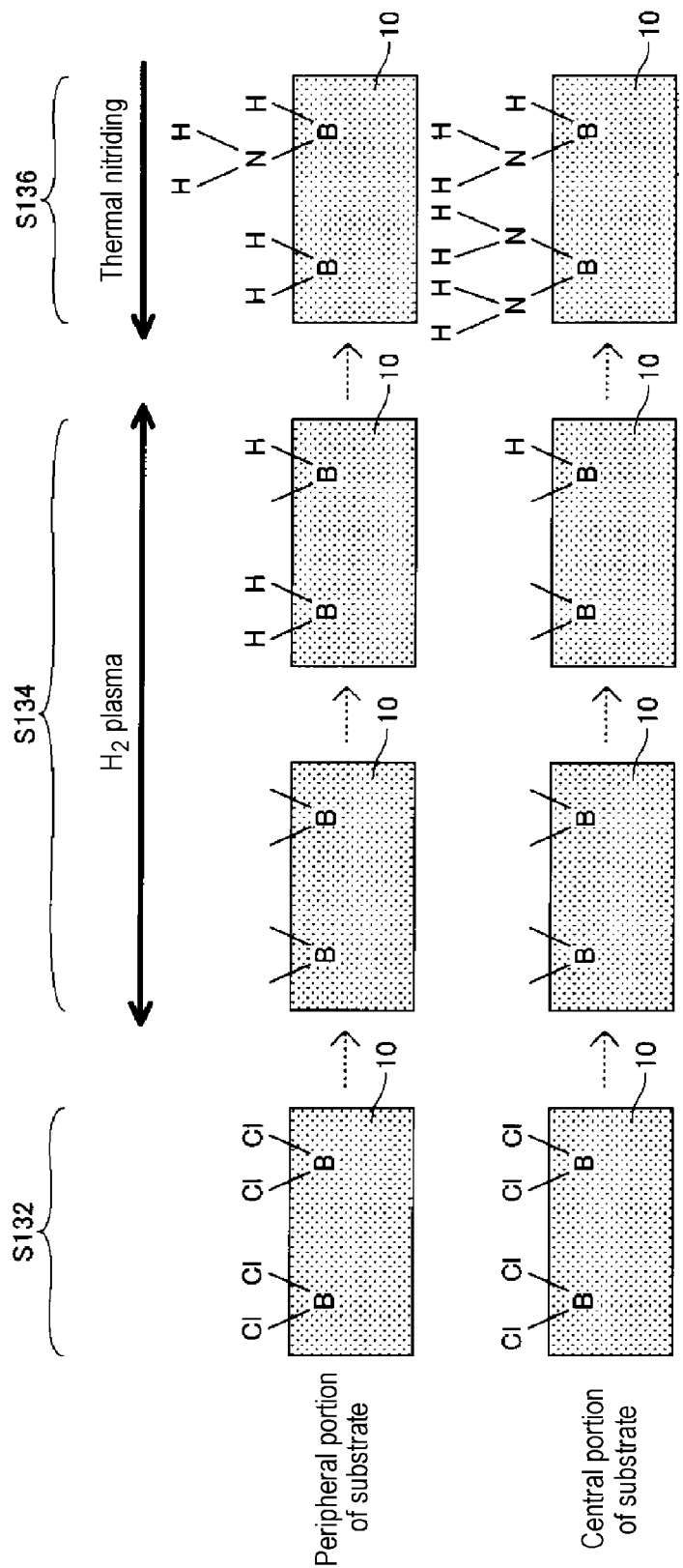
FIG. 17 is an explanatory diagram of a film forming mechanism of a nitride film according to the first embodiment.

Next, a mechanism of forming a nitride film in the substrate processing method according to the present embodiment will be described with reference to FIG. 17 by taking, as an example, the BN film formation shown in FIGS. 14 and 15.

First, in step 132 (S132), $BCl_3$ as a raw material gas is supplied, one Cl atom is desorbed from $BCl_3$ to form $BCl_2$, and $BCl_2$ adheres to the substrate 10. Next, in step 134 (S134), when plasma-converted hydrogen is supplied, Cl atoms are desorbed from $BCl_2$ adhered to the substrate 10 by the plasma-converted hydrogen. Furthermore, hydrogen is bonded to dangling bonds of B where Cl atoms are desorbed, so as to replace Cl atoms. When the BN film is formed, the substrate 10 is rotating, and the plasma-converted hydrogen is supplied from the peripheral portion of the substrate. Therefore, a larger number of hydrogen atoms are bonded to the peripheral portion of the substrate 10 than the central portion of the substrate 10. In step 136 (S136), an ammonia gas which is not converted into plasma is supplied as a nitriding gas. The ammonia gas does not have energy enough to displace the hydrogen atom bonded to B. Therefore, the reaction with B not bonded to the hydrogen atom proceeds predominantly. A larger amount of ammonia gas is bonded to the central portion the substrate 10 than the peripheral portion of the substrate 10. Accordingly, as shown in FIG. 16, it is presumed that the thickness of the nitride film is larger in the central portion of the substrate 10 than in the peripheral portion of the substrate 10.

If the nitriding is performed by plasma nitriding without performing thermal nitriding after the process of step 134, hydrogen atoms bonded to B are easily desorbed when exposed to plasma. Therefore, B bonded to hydrogen atoms is also subjected to nitriding. Since the plasma-converted nitriding gas is supplied from the peripheral portion of the substrate, a larger amount of ammonia gas adheres to the peripheral portion of the substrate 10 than to the central portion of the substrate 10. For this reason, as shown in FIG. 16, it is considered that the thickness of the nitride film is larger in the peripheral portion of the substrate 10 than in the central portion of the substrate 10.

In the above description, there has been described the case where the thermal nitriding step is first performed and then the plasma nitriding step is performed. However, the same effects can be obtained even when the order is reversed (plasma nitriding→thermal nitriding). However, as described above, it is more preferable to first perform the thermal nitriding step and then perform the plasma nitriding step. That is, when the plasma nitriding step is performed first, for example, the hydrogen atoms generated in the process of converting ammonia into plasma and performing nitriding are bonded to the dangling bonds of B (particularly, the central portion of the substrate 10), and may possibly hinder the progress of thermal nitriding. In this case, the effect of thermal nitriding which nitrides the central portion of the substrate 10 rather than the peripheral portion of the substrate 10 is weakened, and the adjustment range of the film distribution of the nitride film may be narrowed. Accordingly, it is more preferable to first perform the thermal nitriding step and then perform the plasma nitriding step.

Second Embodiment

Next, a second embodiment will be described. This embodiment is a substrate processing method using the substrate processing apparatus according to the first embodiment, and is a nitride film forming method different from the first embodiment. Specifically, as shown in FIG. 18, a step of forming a nitride film by thermal nitriding in step 210 (S210) and a step of forming a nitride film by plasma nitriding in step 220 (S220) are performed. In the subject application, the step of forming the nitride film by thermal nitriding (S210) is sometimes referred to as a first nitride film forming step, and the step of forming the nitride film by plasma nitriding (S220) is sometimes referred to as a second nitride film forming method.

First, the step of forming the nitride film by thermal nitriding (S210) will be described. Also in this film forming method, as described above, a purge gas is supplied by the purge gas supply part 140 into the processing container 21, the inside of which is evacuated by the exhaust device 58. Thus, the gas remaining inside the processing container 21 is replaced with the purge gas. The flow rate of the purge gas is, for example, in a range of from 50 sccm to 5000 sccm. In the step of forming the nitride film, the purge gas is continuously supplied into the processing container 21. Purging with the purge gas is performed in a state in which the raw material gas and the nitriding gas are not supplied.

First, as shown in step 132 (S132), a raw material gas supply step of supplying a raw material gas is performed. Specifically, a raw material gas is supplied from the raw material gas supply part 110 into the processing container 21, the inside of which is evacuated by the exhaust device 58. The raw material gas is, for example, a DCS gas. Thus, a Si-containing layer is formed on the surface of the substrate 10. The flow rate of the raw material gas is, for example, in a range of from 500 sccm to 3000 sccm.

Next, as shown in step 134 (S134), a hydrogen gas supply step of supplying a plasma-converted hydrogen gas is performed. Specifically, a hydrogen gas is supplied from the hydrogen gas supply part 120 into the processing container 21, the inside of which is evacuated by the exhaust device 58. At this time, the hydrogen gas is converted into plasma by the plasma generator 90. The flow rate of the hydrogen gas is, for example, in a range of from 500 sccm to 5000 sccm.

Next, as shown in step 136 (S136), a thermal nitriding step of supplying a nitriding gas without generating plasma is performed. Specifically, a nitriding gas is supplied by the nitriding gas supply part 130 into the processing container 21, the inside of which is evacuated by the exhaust device 58. The nitriding gas is, for example, an ammonia gas. The Si-containing layer is thermally nitrided by the ammonia gas heated by the processing container heater 60. The flow rate of the nitriding gas is, for example, in a range of from 500 sccm to 7000 sccm.

Purging with the purge gas is performed between steps 132 and 134, between steps 134 and 136, and between step 136 and the next step.

In the step of forming the nitride film by thermal nitriding (S210), the above-described steps may be defined as one cycle, and may be repeated by a plurality of cycles.

Next, the step of forming the nitride film by plasma nitriding (S220) will be described. After the step of forming the nitride film by thermal nitriding (S210), a purge gas is supplied into the processing chamber 21 by the purge gas supply part 140. Thus, the gas remaining inside the processing container 21 is replaced with the purge gas. The flow rate of the purge gas is, for example, in a range of from 50 sccm to 5000 sccm. In the step of forming the nitride film, the purge gas is continuously supplied into the processing container 21. Purging with the purge gas is performed in a state in which the raw material gas and the nitriding gas are not supplied.

First, as shown in step 132 (S132), a raw material gas supply step of supplying a raw material gas is performed. Specifically, a raw material gas is supplied from the raw material gas supply part 110 into the processing container 21, the inside of which is evacuated by the exhaust device 58. The raw material gas is, for example, a DCS gas. Thus, a Si-containing layer is formed on the surface of the substrate 10. The flow rate of the raw material gas is, for example, in a range of from 500 sccm to 3000 sccm.

Next, as shown in step 134 (S134), a hydrogen gas supply step of supplying a plasma-converted hydrogen gas is performed. Specifically, a hydrogen gas is supplied from the hydrogen gas supply part 120 into the processing container 21, the inside of which is evacuated by the exhaust device 58. At this time, the hydrogen gas is converted into plasma by the plasma generator 90. The flow rate of the hydrogen gas is, for example, in a range of from 500 sccm to 5000 sccm.

Next, as shown in step 138 (S138), a plasma nitriding step of supplying a plasma-converted nitriding gas is performed. Specifically, a nitriding gas is supplied from the nitriding gas supply part 130 into the processing container 21, the inside of which is evacuated by the exhaust device 58. The nitriding gas is, for example, an ammonia gas. The ammonia gas is converted into plasma by the plasma generator 90. The Si-containing layer is plasma-nitrided by the active species of the ammonia gas thus generated. The flow rate of the nitriding gas is, for example, in a range of from 500 sccm to 7000 sccm.

Purging with the purge gas is performed between steps 132 and 134, between steps 134 and 138, and between step 138 and the next step.

In the step of forming the nitride film by plasma nitriding (S210), the above-described steps may be defined as one cycle, and may be repeated by a plurality of cycles.

In the above description, there has been described the case where the hydrogen gas supply step is included. However, for example, when the Si-containing layer is plasma-nitrided, the hydrogen gas supply step may be omitted. This is because the same film distribution is obtained regardless of the presence or absence of the hydrogen gas supply step as described with reference to film forming method 1 of the nitride film (FIGS. 5 and 6), film forming method 2 of the nitride film (FIGS. 7 and 8), and FIG. 11.

In the present embodiment, by appropriately adjusting the number of cycles in the step of forming the nitride film by thermal nitriding (S210) and the number of cycles in the step of forming the nitride film by plasma nitriding (S220), it is possible to form a nitride film so as to have a desired film distribution.

The contents other than those described above are the same as the corresponding contents of the first embodiment.

The nitride film formed in the substrate processing apparatus and the substrate processing method according to the present embodiment is not limited to a silicon nitride film, and may be, for example, a titanium nitride film, a boron nitride film, a tungsten nitride film, or the like. In the case of forming the titanium nitride film, for example, a $TiCl_4$ gas is used as the raw material gas. In the case of forming the boron nitride film, for example, a $BCl_3$ gas is used as the raw material gas. In the case of forming the tungsten nitride film, for example, a $WCl_6$ gas is used as the raw material gas.

Furthermore, the plasma generation method is not limited to the method of applying high-frequency power to the internal space of the accommodation portion 29. The plasma may be inductively coupled plasma, microwave plasma or the like. In addition, as the substrate 10, a glass substrate or the like may be used instead of the semiconductor substrate such as the silicon wafer or the like.

According to the substrate processing method of the present disclosure, it is possible to form a nitride film or the like so as to have a desired film distribution.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method for forming a nitride film on a substrate, comprising:
   a raw material gas supply step of supplying a raw material gas containing an element to be nitrided;
   a hydrogen gas supply step of, after the raw material gas supply step, supplying a hydrogen gas activated by plasma;
   a thermal nitriding step of supplying a first nitriding gas containing nitrogen activated by heat and nitriding the element for a first time period; and
   a plasma nitriding step of supplying a second nitriding gas containing nitrogen activated by plasma and nitriding the element for a second time period,
   wherein a ratio between the first time period and the second time period is determined based on a film distribution, the film distribution indicating thickness according to a portion in the nitride film to be formed on the substrate, which ranges from a central portion to a peripheral portion of the nitride film to be formed on the substrate.

2. The method of claim 1, wherein the raw material gas supply step, the hydrogen gas supply step, the thermal nitriding step and the plasma nitriding step are defined as one cycle, and the cycle is repeated a plurality of times.

3. The method of claim 1, wherein the hydrogen gas supply step is performed after performing the raw material gas supply step,
   the thermal nitriding step is performed after performing the hydrogen gas supply step, and
   the plasma nitriding step is performed after performing the thermal nitriding step.

4. The method of claim 1, wherein in the hydrogen gas supply step, an inert gas is further supplied together with the hydrogen gas, and a value of (hydrogen flow rate)/(hydrogen flow rate+inert gas flow rate) is 72% or more.

5. The method of claim 1, wherein the raw material gas is a compound containing the element and a halogen element.

6. A substrate processing method for forming a nitride film on a substrate, comprising:
   a performing step of performing a first cycle for a first number of times; and
   a performing step of performing a second cycle for a second number of times,
   wherein the first cycle includes:
       a first raw material gas supply step of supplying a raw material gas containing an element to be nitrided;
       a first hydrogen gas supply step of, after the first raw material gas supply step, supplying a hydrogen gas activated by plasma; and
       a thermal nitriding step of, after the first hydrogen gas supply step, supplying a first nitriding gas containing nitrogen activated by heat and nitriding the element,
   wherein the second cycle includes:
       a second raw material gas supply step of supplying the raw material gas containing the element to be nitrided; and
       a plasma nitriding step of, after the second raw material gas supply step, supplying a second nitriding gas containing nitrogen activated by plasma and nitriding the element, and
   wherein the first number of times and the second number of times are determined based on a film distribution, the film distribution indicating thickness according to a portion in the nitride film to be formed on the substrate, which ranges from a central portion to a peripheral portion of the nitride film to be formed on the substrate.

7. The method of claim 6, wherein the first cycle and the second cycle are alternately repeated a plurality of times.

8. The method of claim 6, wherein the second cycle further includes a second hydrogen gas supply step of supplying the hydrogen gas activated by plasma between the second raw material gas supply step and the plasma nitriding step.

9. The method of claim 6, wherein in the hydrogen gas supply step, an inert gas is further supplied together with the hydrogen gas, and a value of (hydrogen flow rate)/(hydrogen flow rate+inert gas flow rate) is 72% or more.

10. The method of claim 6, wherein the raw material gas is a compound containing the element and a halogen element.

11. The method of claim 6, wherein the first cycle does not include supplying any plasma-activated nitriding gas.

* * * * *